(12) United States Patent
Clevenger et al.

(10) Patent No.: US 7,989,291 B2
(45) Date of Patent: Aug. 2, 2011

(54) ANISOTROPIC STRESS GENERATION BY STRESS-GENERATING LINERS HAVING A SUBLITHOGRAPHIC WIDTH

(75) Inventors: Lawrence A. Clevenger, LaGrangeville, NY (US); Bruce B. Doris, Brewster, NY (US); Elbert E. Huang, Carmel, NY (US); Sampath Purushothaman, Yorktown Heights, NY (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/712,369

(22) Filed: Feb. 25, 2010

(65) Prior Publication Data

US 2010/0151638 A1 Jun. 17, 2010

Related U.S. Application Data

(62) Division of application No. 12/017,557, filed on Jan. 22, 2008, now Pat. No. 7,696,542.

(51) Int. Cl.
*H01L 29/72* (2006.01)

(52) U.S. Cl. ........ 438/262; 438/142; 438/197; 438/704; 438/775; 438/780

(58) Field of Classification Search .................. 438/142, 438/197, 262, 694, 704, 775, 780
See application file for complete search history.

(56) References Cited

U.S. PATENT DOCUMENTS

| | | |
|---|---|---|
| 6,002,705 A | 12/1999 | Thornton |
| 6,867,425 B2 | 3/2005 | Wicker et al. |
| 7,109,568 B2 | 9/2006 | Kumagai et al. |
| 2005/0040460 A1 | 2/2005 | Chidambarrao et al. |
| 2006/0099793 A1 | 5/2006 | Yang et al. |

(Continued)

FOREIGN PATENT DOCUMENTS

WO 2006/053213 A1 5/2006

OTHER PUBLICATIONS

Y. Kanda, "A Graphical Representation of the Piezoresistance Coefficients in Silicon", IEEE Transactions on Electron Devices, vol. ED-29, No, 1, Jan. 1982, pp. 64-70.

(Continued)

*Primary Examiner* — Edward Wojciechowicz
(74) *Attorney, Agent, or Firm* — Scully, Scott, Murphy & Presser, P.C.; Katherine S. Brown, Esq.

(57) ABSTRACT

A protruding structure having a linear edge is formed on a substrate. The protruding structure may be a gate line of a field effect transistor. A stress-generating liner is deposited on the substrate. A non-photosensitive self-assembling block copolymer layer containing at least two immiscible polymeric block components is deposited on the stress-generating liner, and is annealed to allow phase separation of immiscible components. The polymeric resist is developed to remove at least one of the at least two polymeric block components, which formed a pattern of nested lines due to the linear edge of the protruding structure. Linear nanoscale stripes are formed in the polymeric resist which is self-aligning and self-assembled. The stress-generating layer is patterned into linear stress-generating stripes having a sublithographic width. The linear stress-generating stripes provide a predominantly uniaxial stress along their lengthwise direction, providing an anisotropic stress to an underlying semiconductor device.

10 Claims, 11 Drawing Sheets

U.S. PATENT DOCUMENTS

| | | |
|---|---|---|
| 2006/0118880 A1 | 6/2006 | Komoda |
| 2007/0184597 A1 | 8/2007 | Polishchuk et al. |
| 2007/0246776 A1 | 10/2007 | Moroz et al. |
| 2007/0293041 A1 | 12/2007 | Yang et al. |
| 2007/0296001 A1 | 12/2007 | Chidambarrao et al. |
| 2008/0012019 A1 | 1/2008 | Zhu et al. |
| 2008/0014690 A1* | 1/2008 | Chu et al. ............... 438/197 |

OTHER PUBLICATIONS

P. Nealey et al., "Self-assembling resists for nanolithography", IEEE, 2005.

PCT/US09/31043 Notice of Transmittal of the International Search Report and the Written Opinion Dated Mar. 11, 2009.

* cited by examiner

ANISOTROPIC STRESS GENERATION BY STRESS-GENERATING LINERS HAVING A SUBLITHOGRAPHIC WIDTH

CROSS REFERENCE TO RELATED APPLICATION

This application is a divisional of U.S. patent application Ser. No. 12/017,557, filed Jan. 22, 2008, the entire content and disclosure of which is incorporated herein by reference.

FIELD OF THE INVENTION

The present invention relates generally to semiconductor devices for integrated circuits, and more particularly to a metal oxide semiconductor field effect transistor (MOSFET) structure under an anisotropic stress generated by a stress-generating liner having a sublithographic width, and methods for manufacturing the same.

BACKGROUND OF THE INVENTION

Performance of semiconductor devices may be enhanced by increasing carrier (electron or hole) mobility in some semiconductor devices such as a metal oxide semiconductor field effect transistor (MOSFET). When stress is applied to the channel of a semiconductor transistor, the mobility of carriers, and as a consequence, the transconductance and the on-current of the transistor are altered from their original values for an unstressed semiconductor. This is because the applied stress and the resulting strain on the semiconductor structure within the channel affects the band gap structure (i.e., breaks the degeneracy of the band structure) and changes the effective mass of carriers. The effect of the stress depends on the crystallographic orientation of the plane of the channel, the direction of the channel within the crystallographic orientation, and the direction of the applied stress. Manipulating stress is an effective way of improving the minority carrier mobility in a MOSFET and increasing the transconductance (or reduced serial resistance) of the MOSFET that requires relatively small modifications to semiconductor processing while providing significant enhancement to MOSFET performance.

The effect of a stress on conductivity of a material is in general called the "piezoresistance effect." Semiconductor materials typically display a piezoresistive effect since the stress induces strain, which in turn changes the band structure of the semiconductor material. The piezoresistance effect depends on the composition of the semiconductor material, doping type of the semiconductor material, direction of the current flow relative to the crystallographic axes of the semiconductor material, direction and magnitude of the applied stress, and the temperature of the semiconductor material. Quantitative analysis of the piezoresistance effect on silicon is disclosed in Y. Kanda, "A Graphical Representation of the Piezoresistance Coefficients in Silicon," IEEE Transactions on Electron Devices, Vol. ED-29, pp. 64-70, No. 1, Jan. (1982), which is herein incorporated by reference.

For a block of semiconductor material, using [100], [010], and [001] axes as a reference frame, the fractional resistivity change $\Delta$ is related to the stress X applied to the block of the semiconductor material through a piezoresistance coefficient matrix $\Pi$ by the following formula, $\Delta = \Pi X$, wherein $$\Delta = \begin{bmatrix} \Delta_{11} \\ \Delta_{22} \\ \Delta_{33} \\ \Delta_{23} \\ \Delta_{31} \\ \Delta_{12} \end{bmatrix}, \Pi = \begin{bmatrix} \pi_{11} & \pi_{12} & \pi_{12} & 0 & 0 & 0 \\ \pi_{12} & \pi_{11} & \pi_{12} & 0 & 0 & 0 \\ \pi_{12} & \pi_{12} & \pi_{11} & 0 & 0 & 0 \\ 0 & 0 & 0 & \pi_{44} & 0 & 0 \\ 0 & 0 & 0 & 0 & \pi_{44} & 0 \\ 0 & 0 & 0 & 0 & 0 & \pi_{44} \end{bmatrix}, \text{and } X = \begin{bmatrix} \sigma_{11} \\ \sigma_{22} \\ \sigma_{33} \\ \sigma_{23} \\ \sigma_{31} \\ \sigma_{12} \end{bmatrix},$$

and wherein the suffixes 1, 2, and 3 refer to each of the [100], [010], and [001] axes, respectively.

A piezoresistive coefficient, o in the direction of the channel, i.e., in the direction of current flow, of a MOSFET formed in an arbitrary orientation on the block of the semiconductor material may then be calculated. In general, the piezoresistive coefficient, o in the direction of the channel is dependent on the direction of the stress.

To illustrate an example, a p-type MOSFET, i.e., a "PMOSFET" or a "PFET" for short, and an n-type MOSFET, i.e., an "NMOSFET" or an "NFET" for short, formed on a silicon substrate having a surface orientation of (001) is considered. The channel, i.e., the direction of the current flow, is along a [110] crystallographic orientation in this case. A coordinate system having an X-direction along the [110] crystallographic orientation, a Y-direction along a [1 $\bar{1}$ 0] crystallographic orientation, and a Z-direction along a [001] crystallographic orientation is adopted. The X-Y plane is the plane of the interface between the channel and a gate dielectric. Piezoresistive coefficients along the X, Y, and Z direction, respectively, are tabulated in Table 1.

TABLE 1

Piezoresistive coefficients of silicon for uniaxial stress applied along selected orientations for current flowing along a [110] crystallographic orientation (Unit: $1.0 \times 10^{-12}$ cm$^2$/dyne)

| Direction | Crystallographic orientation | Piezoresistive coefficient for a PFET | Piezoresistive coefficient for an NFET |
|---|---|---|---|
| X | [110] | $-31.6 \times 10^{-12}$ cm$^2$/dyne | $71.8 \times 10^{-12}$ cm$^2$/dyne |
| Y | [1$\bar{1}$0] | $-17.6 \times 10^{-12}$ cm$^2$/dyne | $-66.3 \times 10^{-12}$ cm$^2$/dyne |
| Z | [001] | $53.5 \times 10^{-12}$ cm$^2$/dyne | $-1.1 \times 10^{-12}$ cm$^2$/dyne |

A uniaxial stress along the direction of the channel, i.e., along the X-direction, is herein referred to as a longitudinal stress, while a uniaxial stress along the direction perpendicular to the direction of the channel and within the plane of the channel, i.e., along the Y-direction, is herein referred to as a transverse stress. A uniaxial stress along the direction perpendicular to the plane of the channel, i.e., along the Z-direction, is herein referred to as a vertical stress. Since the mobility of charge carriers is proportional to the conductivity, which is inversely proportional to the resistivity, the performance of a PFET formed on a (001) silicon substrate and having a channel along a [110] crystallographic orientation, as measured by its on-current, increases under a compressive longitudinal stress, a tensile transverse stress, and/or a tensile vertical stress. The performance of an NFET formed on a (001) silicon substrate and having a channel along a [110] crystallographic orientation, as measured by its on-current, increases under a tensile longitudinal stress, a tensile transverse stress, and/or a compressive vertical stress. Thus, a tensile transverse improves performance of the PFET and the NFET if each is formed on a (001) silicon substrate and has a channel along a

[110] crystallographic orientation. However, applying such a tensile stress along a longitudinal direction would produce an advantageous effect in the case of the NFET, while producing a disadvantageous effect in the case of the PFET.

Selection of different materials and different crystallographic orientations may generate different responses for various semiconductor devices in general. In many of these cases, a uniaxial stress present in one direction within the plane of the surface of a semiconductor substrate may confer performance enhancement to both a PFET and an NFET. In other words, the PFET and the NFET may be placed such that a uniaxial transverse stress enhances performance of the PFET and the NFET. Such uniaxial transverse stress may be compressive or tensile.

In view of the above, there exists a need for semiconductor structures for applying a uniaxial stress anisotropically on semiconductor devices such that the uniaxial stress is applied predominantly in one direction and not in another direction.

Further, there exists a need for semiconductor structures comprising a transistor in which an applied stress is predominantly a uniaxial transverse stress.

Yet further, there exists a need for semiconductor structures comprising a PFET and an NFET, each having an applied stress that is predominantly a uniaxial transverse stress.

SUMMARY OF THE INVENTION

The present invention addresses the needs described above by providing an anisotropic stress to a semiconductor device generated by patterning of a stress-generating liner into strips having sublithographic width through the use of nanoscale self-aligning self-assembled structures, and methods of manufacturing the same.

In the present invention, a protruding structure having a linear edge is formed on a substrate. The protruding structure may be a gate line of a field effect transistor. A stress-generating liner is deposited on the substrate. A non-photosensitive self-assembling block copolymer layer containing at least two immiscible polymeric block components is deposited on the stress-generating liner, and is annealed to allow phase separation of immiscible components. The polymeric resist is developed to remove at least one of the at least two polymeric block components, which formed a pattern of nested lines due to the linear edge of the protruding structure. Linear nanoscale stripes are formed in the polymeric resist which is self-aligning and self-assembled. The stress-generating layer is patterned into linear stress-generating stripes having a sublithographic width. The linear stress-generating stripes provide a predominantly uniaxial stress along their lengthwise direction, providing an anisotropic stress to an underlying semiconductor device.

According to an embodiment of the present invention, a semiconductor structure is provided, which comprises:

a semiconductor device structure located on a semiconductor substrate and including a linear edge protruding above the semiconductor substrate; and a plurality of linear stress-generating stripes comprising a stress-generating material located on the semiconductor substrate, wherein lengthwise edges of each of the linear stress-generating stripes are parallel to the linear edge.

In one embodiment, the plurality of the linear stress-generating stripes provides a substantially uniaxial stress to the semiconductor device in a direction that is parallel to the linear edge.

In another embodiment, each of the plurality of the linear stress-generating stripes has a sublithographic width, wherein the width is measured in a direction perpendicular to one of the lengthwise edges.

In even another embodiment, a spacing between an adjacent pair of the plurality of the linear stress-generating stripes is sublithographic.

In yet another embodiment, a lengthwise dimension of each of the linear stress-generating stripes is lithographic.

In still another embodiment, the a plurality of linear stress-generating material comprises silicon nitride having an intrinsic stress equal to or greater than about 0.15 GPa in magnitude.

In a further embodiment, the semiconductor device structure comprises a gate conductor line of a field effect transistor.

In an even further embodiment, the semiconductor structure further comprising a dielectric gate spacer laterally abutting and surrounding the gate conductor line.

In a yet further embodiment, the plurality of the linear stress-generating stripes vertically abuts a metal semiconductor alloy portion.

According to another aspect of the present invention, another semiconductor structure is provided, which comprises:

a field effect transistor located on a semiconductor substrate and comprising a gate conductor line having a linear edge;

a first plurality of linear stress-generating stripes vertically abutting a source side metal semiconductor alloy region and comprising a stress-generating material; and a second plurality of linear stress-generating stripes vertically abutting a drain side metal semiconductor alloy region and comprising the stress-generating material, wherein lengthwise edges of each of the linear stress-generating stripes of the first and second pluralities are parallel to a lengthwise edge of the gate conductor line.

In one embodiment, the semiconductor structure further comprises:

a source side contact via contacting at least two lengthwise edges of the first plurality of the linear stress-generating stripes and the source side metal semiconductor alloy region; and a drain side contact via contacting at least two lengthwise edges of the second plurality of the linear stress-generating stripes and the drain side metal semiconductor alloy region.

In another embodiment, the first and second pluralities of linear stress-generating stripes generate a substantially uniaxial transverse stress to a channel of the field effect transistor.

In even another embodiment, the substantially uniaxial transverse stress has a magnitude equal to or greater than 0.15 GPa and is compressive or tensile.

In yet another embodiment, the semiconductor substrate is a (001) silicon substrate, and a channel of the field effect transistor is along one of <110> crystallographic orientations.

In still another embodiment, the semiconductor structure further comprises:

another field effect transistor located on the semiconductor substrate and including another gate line, another source side metal semiconductor alloy region, and another drain side metal semiconductor alloy region; and a stress-generating layer comprising the stress-generating material and abutting the another gate line, the another source side metal semiconductor alloy region, and the another drain side metal semiconductor alloy region, wherein the stress-generating layer applies a longitudinal stress and a transverse stress to a channel of the another field effect transistor.

In still yet another embodiment, the semiconductor structure further comprises another field effect transistor located on the semiconductor substrate and disjoined from any structure comprising the stress-generating material.

According to yet another aspect of the present invention, a method of forming a semiconductor structure is provided, which comprises:

forming a semiconductor device structure on a semiconductor substrate, wherein the semiconductor device structure has a linear edge protruding above the semiconductor substrate;

forming a stress-generating layer comprising a stress-generating material on the semiconductor device structure; and patterning the stress-generating layer into a plurality of linear stress-generating stripes, each having lengthwise edges that are parallel to the linear edge.

In one embodiment, the plurality of the linear stress-generating stripes applies a substantially uniaxial stress to the semiconductor device structure in a direction that is parallel to the linear edge.

In another embodiment, the method further comprises:

applying a non-photosensitive self-assembling block copolymer layer comprising a first polymeric block component and second polymeric block component on an underlayer on a substrate;

forming a plurality of polymeric stripes comprising the first polymeric block component and having a sublithographic width; and transferring a pattern in the plurality of the polymeric stripes into the stress-generating layer, whereby the plurality of the linear stress-generating stripes are formed.

In even another embodiment, each of the plurality of the linear stress-generating stripes has a sublithographic width, wherein the width is measured in a direction perpendicular to one of the lengthwise edges.

In yet another embodiment, the method further comprises:

forming a matrix of the second polymeric block component laterally abutting and surrounding each of the plurality of the polymeric stripes; and removing the matrix selective to the plurality of the polymeric stripes.

In still another embodiment, a lengthwise dimension of each of the plurality of the linear stress-generating stripes is lithographic, and a spacing between an adjacent pair of the plurality of the linear stress-generating stripes is sublithographic.

In still yet another embodiment, the semiconductor device structure comprises a gate conductor line of a field effect transistor, and the plurality of the linear stress-generating stripes applies a substantially uniaxial stress to a channel of the field effect transistor in a direction that is parallel to a lengthwise edge of the gate conductor line.

In a further embodiment, the method further comprises:

forming another field effect transistor on the semiconductor substrate, wherein the another field effect transistor includes another gate line, another source side metal semiconductor alloy region, and another drain side metal semiconductor alloy region; and forming a stress-generating layer comprising the stress-generating material and abutting the another gate line, the another source side metal semiconductor alloy region, and the another drain side metal semiconductor alloy region, wherein the stress-generating layer applies a longitudinal stress and a transverse stress to a channel of the another field effect transistor.

In an even further embodiment, the method further comprises forming another field effect transistor located on the semiconductor substrate and disjoined from any structure comprising the stress-generating material.

Figure 1A:
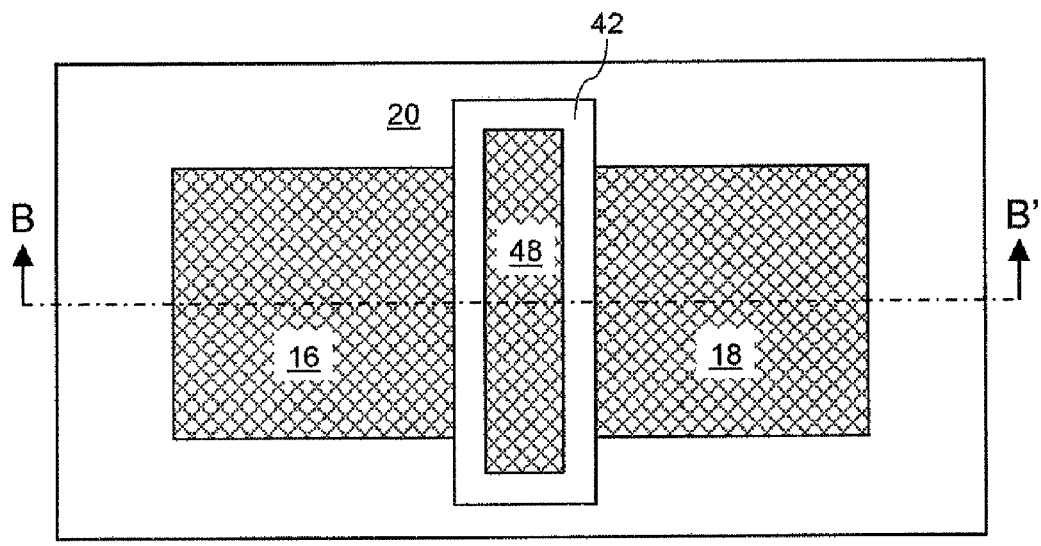
FIGS. 1A-7B are sequential views of a first exemplary semiconductor structure according to the present invention.

Figures with the same numeral correspond to a same stage of a manufacturing process. Figures with the suffix, "A" are top down views in which a middle-of-line dielectric layer 80 is omitted when applicable. Figures with the suffix, "B" are vertical cross-sectional views along the plane B-B' of the figure with the same figure number and the suffix, "A." Arrows represent exemplary directions applied to underlying structures by various stress-generating structures directly thereupon.

DETAILED DESCRIPTION OF THE INVENTION

As stated above, the present invention relates to a metal oxide semiconductor field effect transistor (MOSFET) structure under an anisotropic stress generated by a stress-generating liner having a sublithographic width, and methods for manufacturing the same, which are now described in detail with accompanying figures. It is noted that like and corresponding elements are referred to by like reference numerals.

Figure 1B:
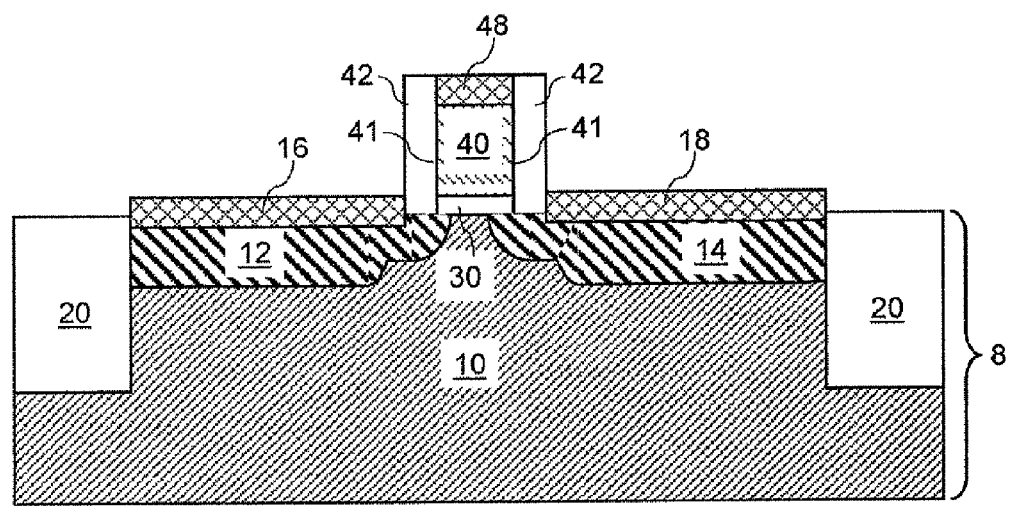

Referring to FIGS. 1A and 1B, a first exemplary structure according to the present invention is shown, which comprises a semiconductor substrate 8 containing a substrate layer 10 and a shallow trench isolation structure 20. The substrate layer 10 comprises a semiconductor material such as Si, SiC, SiGe, SiGeC, Ge alloys, GaAs, InAs, InP, other III-V or II-VI compound semiconductor materials. In one example, the semiconductor substrate is a silicon having a (001) surface orientation. The semiconductor substrate 8 may be a bulk substrate, a semiconductor-on-insulator (SOI) substrate, or a hybrid substrate having a bulk portion and an SOI portion. The substrate layer 10 may be under a biaxial stress through an epitaxial alignment of lattice mismatched heterogeneous semiconductor layers, for example, as in a silicon-germanium on insulator (SGOI) substrate or a strained silicon directly on insulator (SSDOI) substrate.

A gate dielectric 30 is formed directly on a top surface of the semiconductor substrate 8. The gate dielectric 30 may comprise a thermally grown or conformally deposited silicon dioxide, nitridated silicon oxide, other suitable insulating materials such as high-k dielectric materials having a dielectric constant greater than 3.9, or combinations thereof. A gate conductor line 40 is formed by deposition of a gate conductor layer (not shown), followed by lithographic patterning and etching of the gate conductor layer. The gate conductor line 40 may comprise polysilicon or a polycrystalline silicon germanium alloy. The gate conductor line 40 may, or may not, be doped. In-situ doping or a subsequent ion implantation may be employed to dope the gate conductor line 40 as needed. Alternately, the gate conductor line 40 may comprise a metal gate material compatible with a high-k dielectric material of the gate dielectric.

The gate conductor line 40 contains at least one "linear edge" 41, which is a sidewall extending without a curvature up to a significant distance, i.e., extending to a distance at least equal to a "lithographic minimum dimension." While the lithographic minimum dimension is defined only in relation to a lithography tool and normally changes from generation to generation of semiconductor technology, it is understood that the lithographic minimum dimension and the sublithographic dimension are to be defined in relation to the best performance of lithography tools available at the time of semiconductor manufacturing. As of 2007, the lithographic minimum dimension is about 45 nm and is expected to shrink in the future. A dimension less than the lithographic minimum dimension is herein referred to as a "sublithographic dimension." Preferably, the at least one linear edge 41 extends several times the distance of the lithographic minimum dimension. The term "linear" as employed herein refers to "straight" or "without substantial curvature." The distance may be greater than the lithographic minimum dimension by an order of magnitude or more. In the exemplary semiconductor structure, the gate conductor line 40 contains a pair of linear edges 41, which are parallel to each other, and are perpendicular to the direction of the channel (not shown separately) located directly underneath the gate dielectric 30.

A dielectric gate spacer 42 is formed around the gate conductor line 40. The dielectric gate spacer 42 comprises a dielectric material such as silicon oxide, silicon oxynitride, and/or silicon nitride. For example, the dielectric gate spacer 42 comprises silicon oxide. The dielectric gate spacer 42 laterally abuts and surrounds the gate conductor line 40. Source and drain extension implantations and/or halo implantations may be performed prior to or after the formation of the dielectric gate spacer 42. A source region 12 and a drain region 14, including suitable structures for source extension and drain extension, are formed by the ion implantations and an activation anneal. The source region 12 and the drain region 14 may comprise the same material as the substrate layer 10, or may comprise a different semiconductor material, which may, or may not, be epitaxially aligned to the material of the substrate layer 10. For example, the substrate layer 10 may comprise single crystalline silicon, and the source region 12 and the drain region 14 comprise a silicon germanium alloy or a silicon carbon alloy that is epitaxially aligned to the material of the substrate layer 10. The outer edges of the dielectric gate spacer 42 are linear, i.e., straight since the dielectric gate spacer 42 is conformal to the pair of linear edges 41 of the gate conductor line 40.

Various metal semiconductor alloy regions are formed on exposed semiconductor surfaces by deposition of a metal layer (not shown) followed by anneal that induces reaction of the metal layer with the underlying semiconductor material. Specifically, a source side metal semiconductor alloy region 16 is formed on the source region 12, a drain side metal semiconductor alloy region 18 is formed on the drain region 14, and a gate conductor metal semiconductor alloy region 48 is formed on the gate conductor line 40.

The metal layer comprises a metal that can react with the semiconductor materials of the substrate layer 10 and the gate conductor line to form the various metal semiconductor alloy regions (16, 18, 48). In case the semiconductor substrate 8 comprises silicon, the various metal semiconductor alloy regions (16, 18, 48) comprise metal silicides. For example, the metal may be Ti, Co, Ni, Ta, W, Pt, Pd or an alloy thereof. After deposition of the metal layer and, optionally, a metal nitride capping layer thereupon, the first exemplary semiconductor structure is annealed at a pre-determined elevated temperature at which the deposited metal layer reacts with exposed silicon to form metal silicides of relatively low contact resistance. Unreacted portions of the metal layer and the optional metal nitride capping layer are removed after formation of the metal silicides.

Figure 2A:
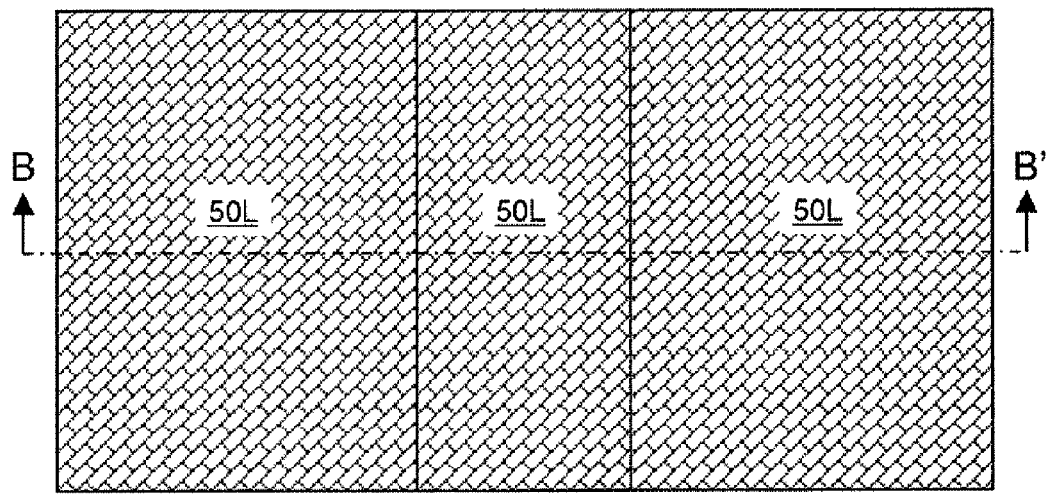
Figure 2B:
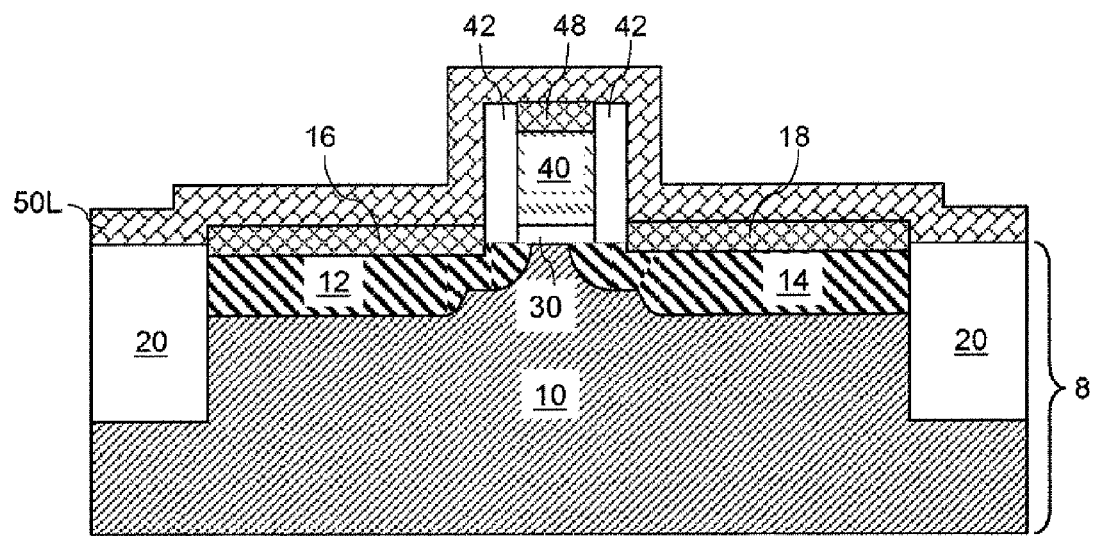

Referring to FIGS. 2A and 2B, a stress-generating layer 50L is formed directly on all exposed surfaces of the first exemplary semiconductor structure including the source side metal semiconductor alloy region 16, the drain side metal semiconductor alloy region 18, the outer edges of the dielectric gate spacer 42, a top surface of the gate conductor metal semiconductor alloy region 48, and the shallow trench isolation structure 20. The stress-generating layer 50L comprises a stress-generating material having an intrinsic stress equal to or greater than about 0.15 GPa.

The stress-generating material may be a dielectric material such as silicon nitride, which may be formed with a high intrinsic tensile stress or a high intrinsic compressive stress by plasma enhanced chemical vapor deposition (PECVD), rapid thermal chemical vapor deposition (RTCVD), or high density plasma chemical vapor deposition (HDPCVD). The thickness of the stress-generating layer 50L may be from about 10 nm to about 100 nm, and typically from about 25 nm to about 70 nm, although lesser and greater thicknesses are contemplated herein also. The stress-generating layer 50L. The stress-generating layer SOL may be substantially conformal, i.e., have the same thickness on a sidewall and on a horizontal surface, or may be non-conformal, i.e., a thickness on a sidewall is less than a thickness on a horizontal surface.

Figure 3A:
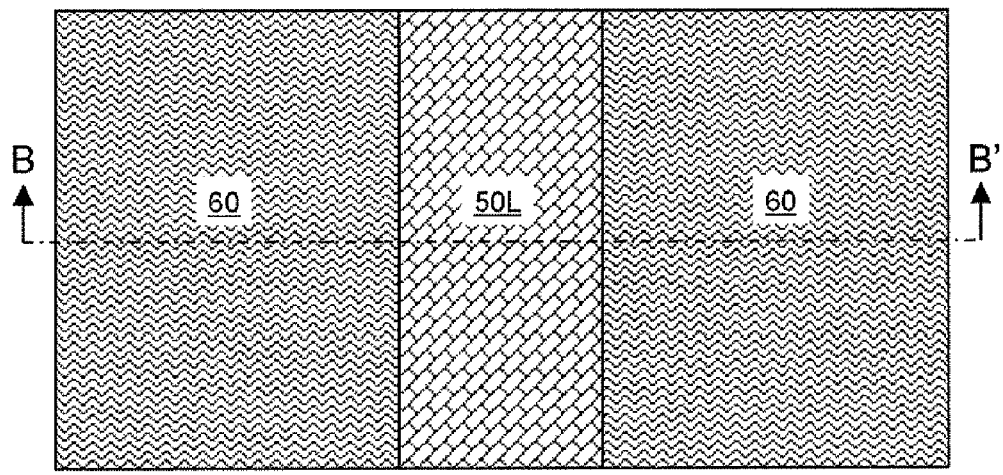
Figure 3B:
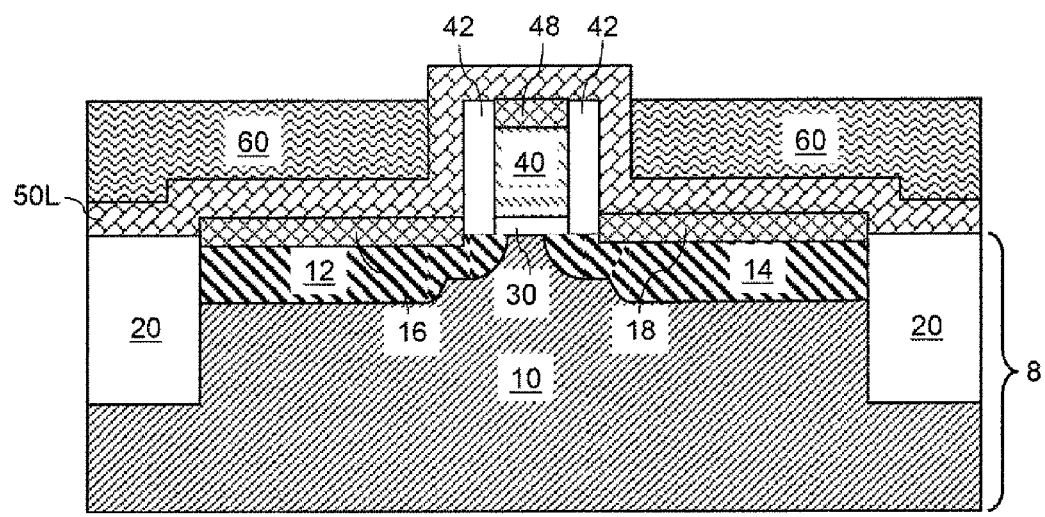

Referring to FIGS. 3A and 3B, a non-photosensitive self-assembling block copolymer layer 60 comprising a first polymeric block component and second polymeric block component is applied on the semiconductor substrate 8, for example, by spin coating. Specifically, the first polymeric block component and the second polymeric block component are dissolved in a suitable solvent system to form a block copolymer solution, which is then applied onto the surface of the stress-generating layer 50L to form the non-photosensitive self-assembling block copolymer layer 60. The non-photosensitive self-assembling block copolymer layer 60 is self-planarizing, and the first polymeric block component and second polymeric block component are immiscible. The non-photosensitive self-assembling block copolymer layer 60 comprises a non-photosensitive polymeric material, of which the patterning is effected not by photons, i.e., optical radiation, but by self-assembly under suitable conditions such as an anneal. Also, the non-photosensitive self-assembling block copolymer layer 60 is not a conventional low-k dielectric material. The non-photosensitive self-assembling block copolymer layer 60 may, or may not, reach a top surface of the portion of the stress-generating layer over the gate conductor line 40. Preferably, a top surface of the non-photosensitive self-assembling block copolymer layer 60 is located below the top surface of the portion of the stress-generating layer over the gate conductor line 40.

Exemplary materials for the first polymeric block component and the second polymeric block component are described in commonly-assigned, copending U.S. patent application Ser. Nos. 11/424,963, filed on Jun. 19, 2006, the contents of which are incorporated herein by reference. Specific examples of self-assembling block copolymers for the non-photosensitive self-assembling block copolymer layer 60 that can be used for forming the structural units of the present invention may include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA). The solvent system used for dissolving the first and second polymeric block components and forming the block copolymer solution may comprise any suitable solvent, including, but not limited to: toluene, propylene glycol monomethyl ether acetate (PGMEA), propylene glycol monomethyl ether (PGME), and acetone.

Referring to FIG. 4, the non-photosensitive self-assembling block copolymer layer 60 is annealed to cause cross-linking of each of the first polymeric block component and the second polymeric block component and to form a self-assembled nanoscale structure. Exemplary processes of annealing the self-assembling block copolymers in the block copolymer layer to form two sets of polymer blocks are described in Nealey et al., "Self-assembling resists for nanolithography," IEDM Technical Digest, December, 2005, Digital Object Identifier 10.1109/IEDM.2005.1609349, the contents of which are incorporated herein by reference. Methods of annealing described in the '963 Application may be employed. The anneal may be performed, for example, at a temperature from about 200° C. to about 300° C. for a duration from less than about 1 hour to about 100 hours.

The self-assembled nanoscale structure comprises two sets of polymeric block structures containing two different polymeric block components. The first set of polymeric block structures comprises a plurality of polymeric stripes 70 comprising the first polymeric block component and having a sublithographic width. The second set of polymeric block structures comprises polymeric matrices 72 comprising the second polymeric block component and laterally abutting and surrounding each of the plurality of the polymeric stripes 70. Specifically, a subset of the polymeric stripes 70, which is herein referred to as a first plurality of polymeric stripes 70, is formed over the source side of the field effect transistor, i.e., above or close to the source region 12. The first plurality of polymeric stripes 70 is surrounded by one of the two polymeric matrices 72. Another subset of the polymeric stripes 70, which is herein referred to as a second plurality of polymeric stripes 70, is formed over the drain side of the field effect transistor, i.e., above or close to the drain region 14. The first plurality of polymeric stripes 70 is surrounded by the other of the two polymeric matrices 72, which comprise a source side polymeric matrix located on the source side and a drain side polymeric matrix located on the drain side.

The outer sidewall of the stress-generating layer 50L on the source side has a linear edge, or a straight edge, since the contour of the linear edge of the gate conductor line 40 on the source side is replicated in the outer sidewall of the dielectric gate spacer 42 and the outer sidewall of the stress-generating layer SOL on the source side. The linear edge replicated in the outer sidewall of the stress-generating layer 50L on the source side serves as a template for self-alignment of the first and second polymeric block components during the formation of the first plurality of the polymeric stripes 70 and the source side polymeric matrix. In the same manner, the outer sidewall of the stress-generating layer 50L on the drain side has another linear edge. The linear edge replicated in the outer sidewall of the stress-generating layer 50L on the drain side serves as a template for self-alignment of the first and second polymeric block components during the formation of the second plurality of the polymeric stripes 70 and the drain side polymeric matrix. Thus, the linear edges of the outer sidewalls of the stress-generating layer 50L, which is replicated from the linear edges of the gate conductor line 40, serves as a template for the alignment of the first and second pluralities of the polymeric stripes 70 and the polymeric matrices 72.

Each of the polymeric stripes 70 has a sublithographic width, typically from about 10 nm to about 40 nm, and more typically from about 15 nm to about 30 nm. The spacing between each adjacent pair of polymeric stripes 70 is also a sublithographic dimension, typically from about 10 nm to about 40 nm, and more typically from about 15 nm to about 30 nm. The spacing between the outer sidewalls of the stress-generating layer 50L and a most proximate polymeric strip 70 is also sublithographic.

Figure 5A:
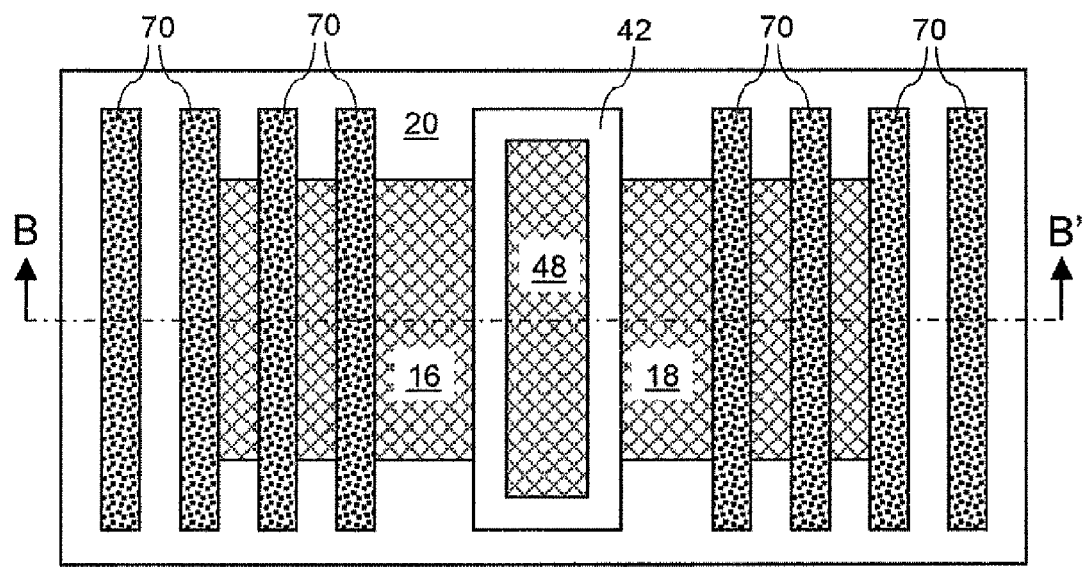
Figure 5B:
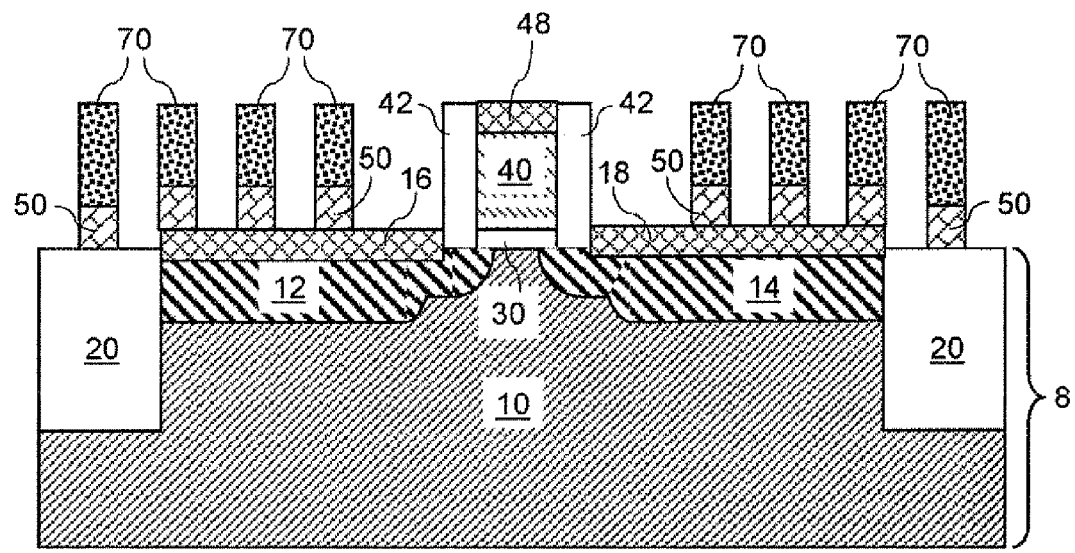

Referring to FIGS. 5A and 5B, the polymeric matrices 72 comprising the second polymeric component is removed selective to the first polymeric component by an anisotropic ion etch such as a reactive ion etch. In one embodiment, the anisotropic ion etch is also selective to the stress-generating layer 50L. In another embodiment, the anisotropic ion etch is not selective to the stress-generating layer 50L, but is selective to the gate conductor metal semiconductor alloy region 48. Thus, the polymeric matrices 72 are removed selective to the polymeric strips 70.

Employing the polymeric stripes 70 as an etch mask, exposed portions of the stress-generating layer 50L is removed by another anisotropic ion etch. The anisotropic etch is selective to the source side metal semiconductor alloy region 16, the drain side metal semiconductor alloy region 18, the gate conductor metal semiconductor alloy region 48, and, preferably, to the dielectric gate spacer 42. The pattern of the polymeric stripes 70, i.e., a pattern of nested parallel lines with sublithographic widths and sublithographic spacings, is transferred into the stress-generating layer 50L to form a plurality of linear stress-generating stripes 50 located directly on the source side metal semiconductor alloy region 16 or the drain side metal semiconductor alloy region 18.

The plurality of linear stress-generating stripes 50 comprises a first plurality of linear stress-generating stripes 50 located on the source side, i.e., on or in proximity to the source side metal semiconductor alloy region 16, and a second plurality of linear stress-generating stripes 50 located on the drain side, i.e., on or in proximity to the drain side metal semiconductor alloy region 18. Since the pattern of the polymeric stripes 70 is identical to the pattern of the first and second pluralities of the linear stress-generating stripes 50, the first plurality of linear stress-generating stripes 50 and the second plurality of linear stress-generating stripes 50 have a pattern of nested parallel lines with sublithographic widths and sublithographic spacings.

Figure 6A:
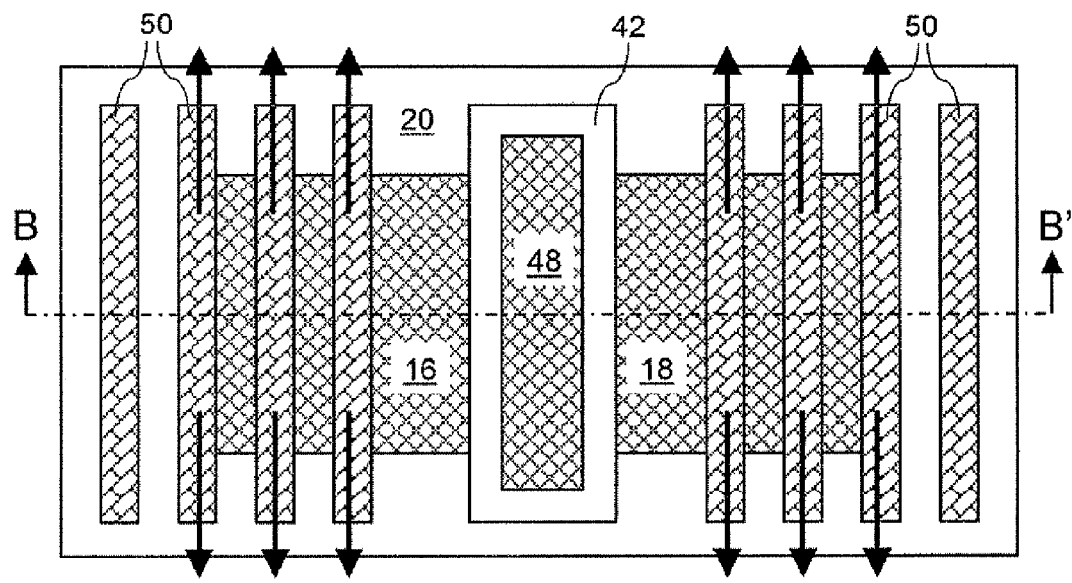
Figure 6B:
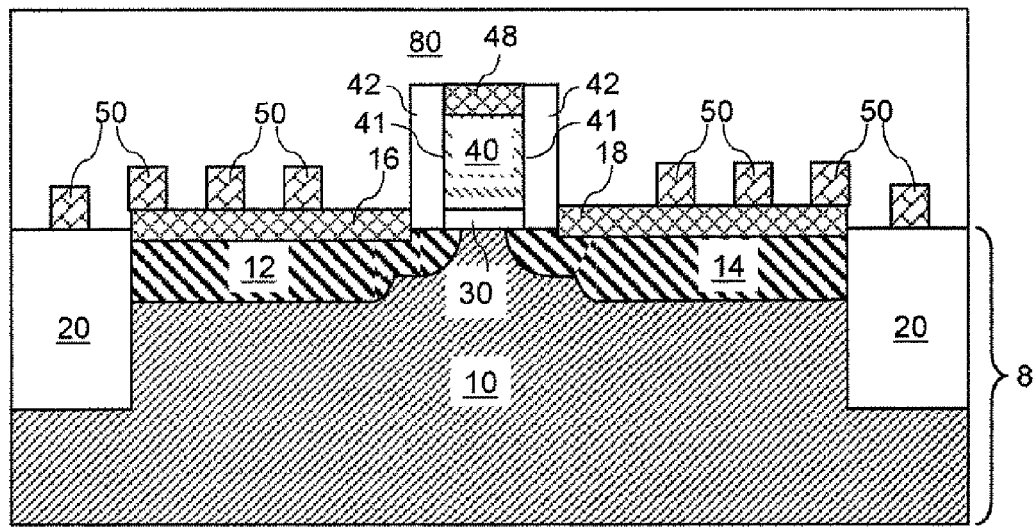

Referring to FIGS. 6A and 6B, the polymeric stripes 70 are removed selective to the plurality of linear stress-generating stripes 50, the source side metal semiconductor alloy region 16, the drain side metal semiconductor alloy region 18, the gate conductor metal semiconductor alloy region 48, and to the dielectric gate spacer 42. Each of the linear stress-generating stripes 50 has a sublithographic width and a lithographic length. The lithographic length may be several times the minimum lithographic dimension, or preferably, greater than the minimum lithographic dimension by an order or magnitude or more. Thus, the direction of stress generated by each of the linear stress-generating stripes 50 is predominantly in the direction along the lengthwise direction of the gate conductor line 40, i.e., perpendicular to the direction of the channel, which is the direction connecting the source region 12 and the drain region 14. Arrows in FIG. 6A schematically illustrate the direction of stress for a case of linear stress-generating stripes 50 comprising a tensile stress generating material. If the linear stress-generating stripes 50 comprise a compressive stress generating material, the directions of the arrows are reversed.

Lengthwise edges of each of the plurality of linear stress-generating stripes 50 are parallel to the linear edges 41 of the gate conductor line 40. The stress applied by the plurality of the linear stress-generating stripes 50 to the source region 12, the drain region 14, and the channel (a portion of the substrate layer 10 between the source region 12 and the drain region 14) is a substantially uniaxial stress in a direction that is parallel to the linear edges 41 of the gate conductor line 40. Each of the plurality of the linear stress-generating stripes 50 has a sublithographic width, which is measured in a direction perpendicular to one of the lengthwise edges, i.e., in the direction of the channel (along the plane of B-B' and confined within the plane of the top surface of the semiconductor substrate 8). The spacing between each adjacent pair of the plurality of the linear stress-generating stripes 50 is sublithographic, and is typically from about 10 nm to about 40 nm, and more typically from about 15 nm to about 30 nm. However, a lengthwise dimension, i.e., the length along the direction of the linear edges 41 of the gate conductor line 40, of each of the linear stress-generating stripes is lithographic.

A typical stress-generating material comprises silicon nitride having an intrinsic stress equal to or greater than about 0.15 GPa in magnitude. The substantially uniaxial stress may be either compressive or tensile.

A middle-of-line (MOL) dielectric layer 80 is deposited on the plurality of the linear stress-generating stripes 50, the source side metal semiconductor alloy region 16, the drain side metal semiconductor alloy region 18, the gate conductor metal semiconductor alloy region 48, the dielectric gate spacer 42, and the shallow trench isolation structure 20, The MOL dielectric layer 80 comprises a dielectric material such as a CVD oxide. The CVD oxide may be an undoped silicate glass (USG), borosilicate glass (BSG), phosphosilicate glass (PSG), fluorosilicate glass (FSG), borophosphosilicate glass (BPSG), or a combination thereof. The thickness of the MOL dielectric layer 80 may be from about 200 nm to about 500 nm. The MOL dielectric layer 80 is preferably planarized, for example, by chemical mechanical polishing (CMP). The MOL dielectric layer 80 may also comprise a mobile ion diffusion barrier layer (not shown), which typically comprises a thin silicon nitride that does not generate any substantial level of stress. The thickness of the mobile ion diffusion barrier layer is typically from about 10 nm to about 80 nm.

Figure 7A:
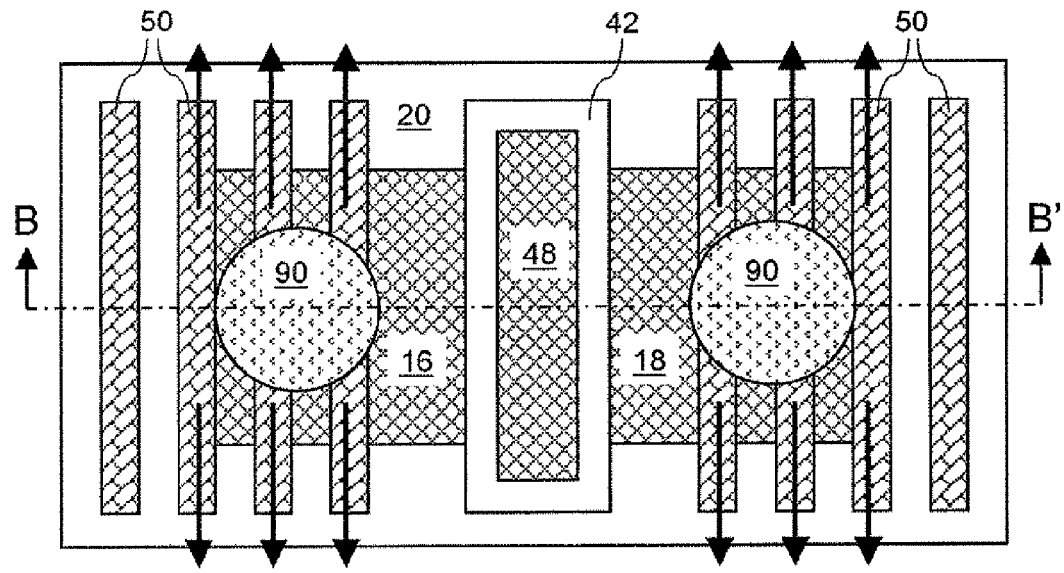
Figure 7B:
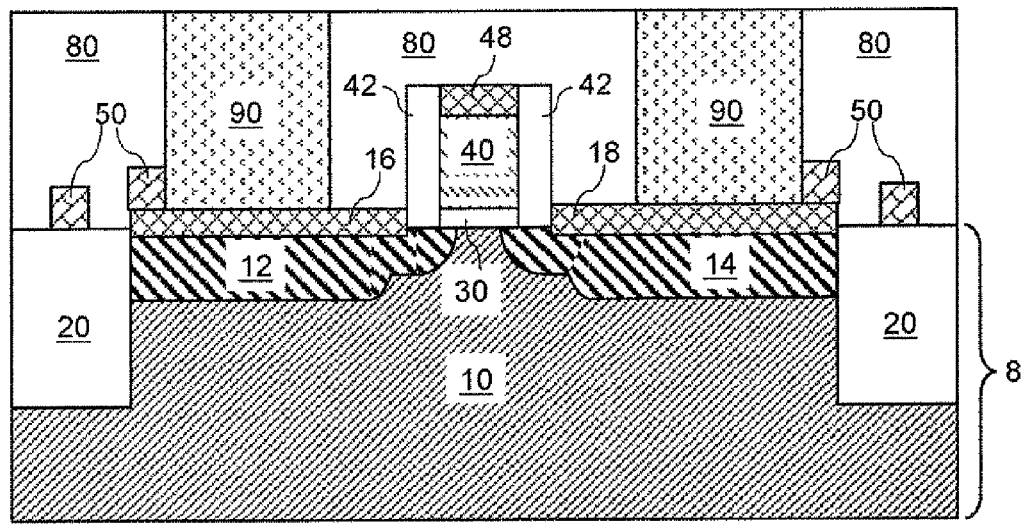

Referring to FIGS. 7A and 7B, contact via holes are formed in the MOL dielectric layer 80 by lithographic methods and an anisotropic etch. The anisotropic etch also removes any portion of the linear stress-generating stripes 50 within each contact via hole, and preferably, is selective to the source side metal semiconductor alloy portion 16 and the drain side metal semiconductor alloy portion 18. At least one additional contact via hole (not shown) is formed directly above the gate conductor metal semiconductor alloy region 48. The various contact via holes are filled with metal to from various contact vias 90. The contact vias 90 directly contact the source side metal semiconductor alloy portion 16, a drain side metal semiconductor alloy portion 18, or the gate conductor metal semiconductor alloy region 49. Metal interconnect structures are thereafter formed to electrically connect the various components of the field effect transistor to other semiconductor components on the semiconductor substrate 8.

Both the width and spacing of the plurality of the linear stress-generating stripes 50 are sublithographic, while the lateral dimension, e.g., the diameter, of the contact vias 90 is necessarily lithographic. Thus, a source side contact via, i.e., a contact via 90 directly contacting the source side metal semiconductor alloy region 16, contacts at least two lengthwise edges of the first plurality of the linear stress-generating stripes 50. A drain side contact via, i.e., a contact via 90 directly contacting the drain side metal semiconductor alloy region 18, contacts at least two lengthwise edges of the second plurality of the linear stress-generating stripes 50.

In a first embodiment of the present invention, a PFET and an NFET, each having a structure substantially the same as the first exemplary semiconductor structure, are formed on the same semiconductor substrate. Such an implementation is beneficial if both the PFET and the NFET benefits from a transverse stress of the same type.

For example, the semiconductor substrate may be a (001) silicon substrate, and the channel of the PFET and the channel of the NFET are along one of <110> crystallographic orientations. The direction of the channel refers to the direction of the current flow in the channel of the transistor. As discussed above, both the PFET and the NFET benefits from a transverse tensile stress if the substrate is a (001) silicon substrate and the channels are along one of the <110> crystallographic orientations.

In general, some combinations of semiconductor materials in the semiconductor substrate, substrate orientations, and channel orientations provide a system comprising a PFET and an NFET, in which the performance of each of the PFET and the NFET improves with a transverse tensile stress or a transverse compressive stress. In such cases, the PFET and the NFET are formed on the same semiconductor substrate and the material for a plurality of linear stress-generating stripes is selected to provide a substantially transverse that enhances performance of both the PFET and the NFET.

In some other cases, a longitudinal stress of the same type as the transverse stress applied to a PFET and an NFET. For example, the semiconductor substrate may be a (001) silicon substrate, and the channel of the PFET and the channel of the NFET are along one of <110> crystallographic orientations. A transverse tensile stress improves performance of both the PFET and the NFET as discussed above. An additional longitudinal stress, which is the same type, i.e., a tensile type, of stress as the transverse tensile stress applied to the PFET and the NFET would further enhance the performance of the NFET.

According to a second embodiment of the present invention, such additional longitudinal stress as well as a transverse stress is provided in a second exemplary semiconductor structure. In the second exemplary semiconductor structure, formation of a plurality of linear stress-generating stripes is prevented on one type of field effect transistor. Instead, a stress-generating layer comprising the stress-generating material and abutting a gate line, a source side metal semiconductor alloy region, and a drain side metal semiconductor alloy region provides both the longitudinal stress and the transverse stress of the same type, i.e., compressive or tensile.

Figure 4A:
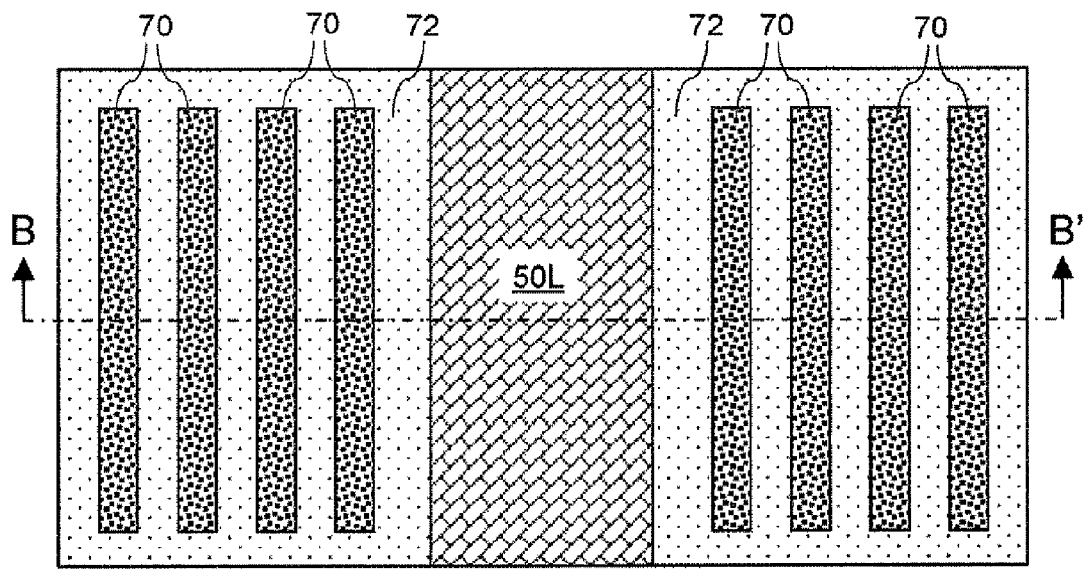
Figure 4B:
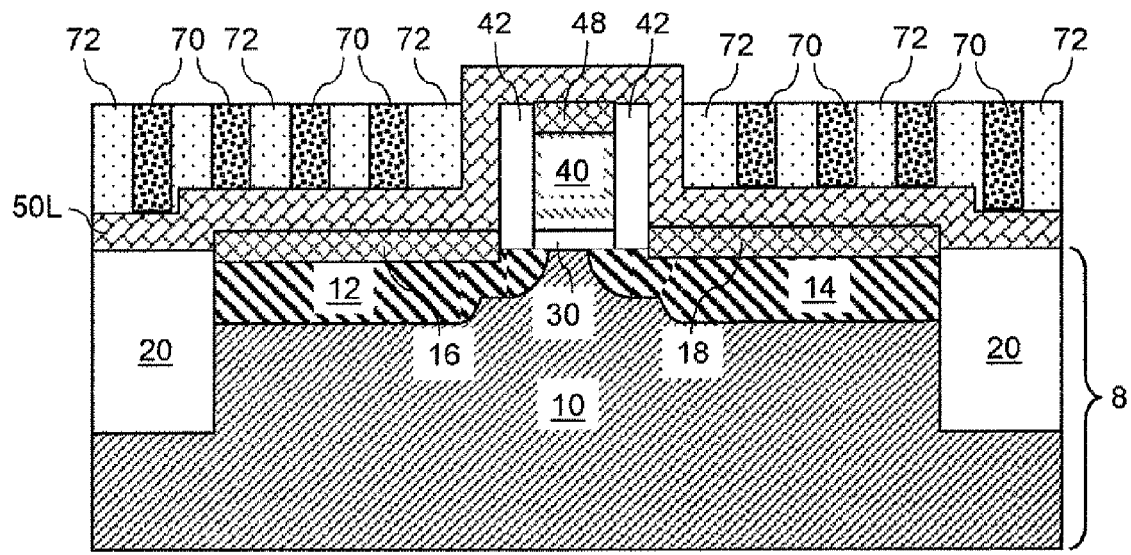

The second exemplary semiconductor structure is formed on the same semiconductor substrate concurrently with the formation of the first exemplary semiconductor structure. Specifically, a first exemplary semiconductor structure containing a first field effect transistor of one conductivity type (i.e., a PFET or an NFET) as shown in FIGS. 4A and 4B and a second exemplary semiconductor structure containing a second field effect transistor of the opposite type (i.e., an NFET if the first field effect transistor is a PFET, and vice versa) and having substantially the same structure as the first exemplary semiconductor structure in FIGS. 4A and 4B (other than the differences in doping) are formed on the same semiconductor substrate 8.

Figure 8A:
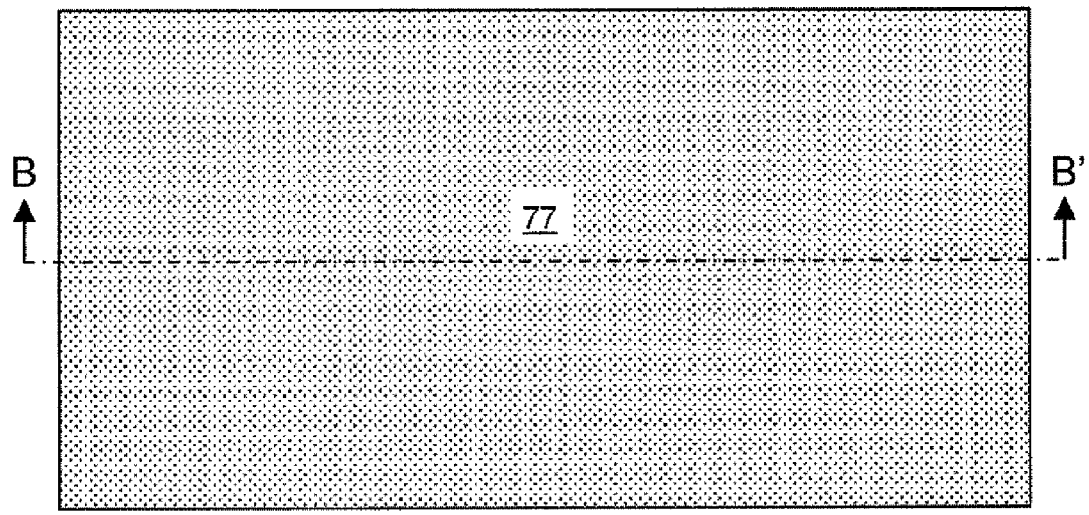
FIGS. 8A-9B are sequential views of a second exemplary semiconductor structure concurrently formed with the first exemplary semiconductor structure according to one embodiment of the present invention.
Figure 8B:
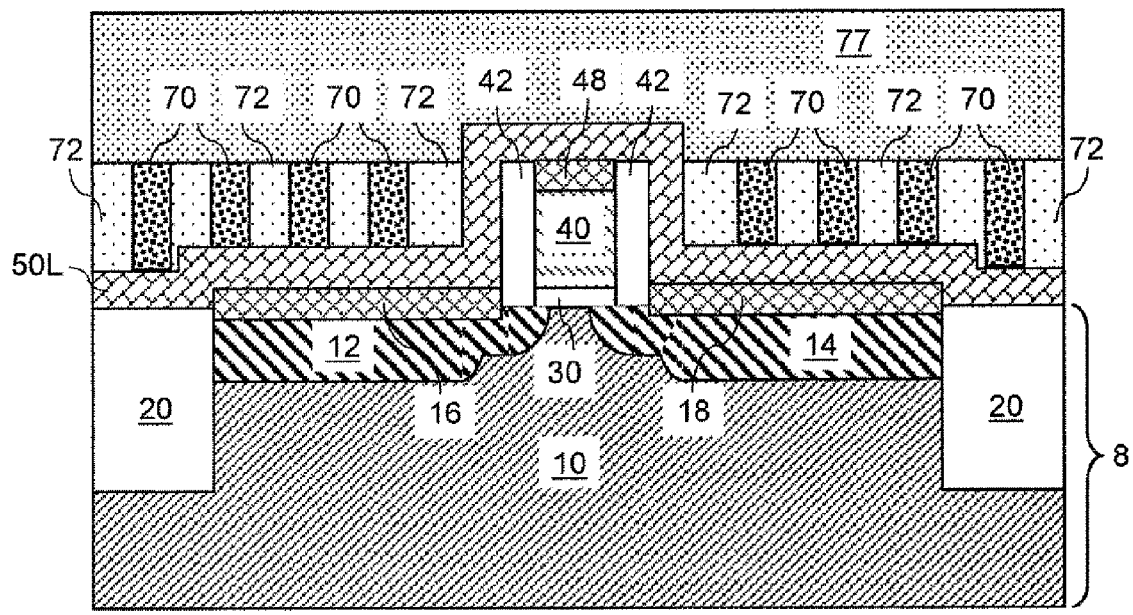

A photoresist 77 is applied over the first and second exemplary semiconductor structures sharing the same semiconductor substrate 8, and lithographically patterned to remove the portion of the photoresist 77 over the first exemplary semiconductor structure, while preserving the photoresist 77 over the second exemplary semiconductor structure. After the patterning of the photoresist 77, the second exemplary semiconductor structure is as shown in FIGS. 8A and 8B, while the first exemplary semiconductor structure is as shown in FIGS. 4A and 4B. During the removal of the polymeric matrices 72 by the anisotropic reactive ion etch, the photoresist 77 protects the entirety of the second exemplary semiconductor structure. Likewise, the second exemplary semiconductor structure is also protected during another anisotropic ion etch that removes exposed portions of the stress-generating layer 50L by which the plurality of linear stress-generating stripes 50 are formed. During the step corresponding to the removal of the polymeric stripes 70 of the first exemplary semiconductor structure, the photoresist 77, the polymeric stripes 70, and the polymeric matrices 72 of the second exemplary semiconductor structure are also removed.

Figure 9A:
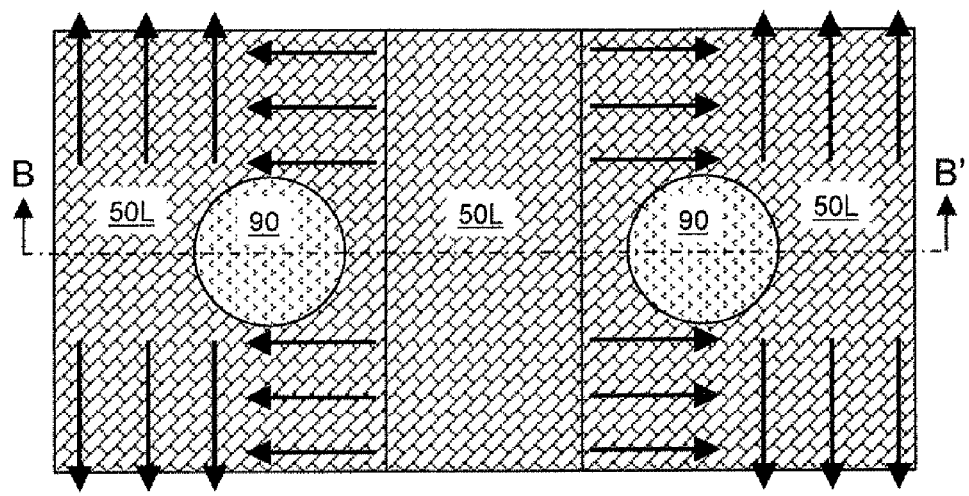
Figure 9B:
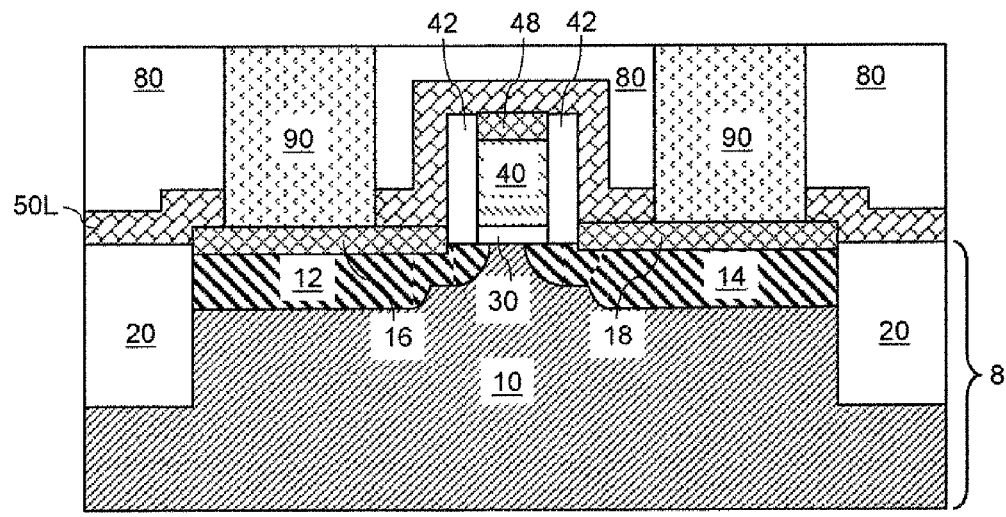

Referring to FIGS. 9A and 9B, identical processing steps are performed simultaneously on the second exemplary semiconductor structure as on the first exemplary semiconductor structure. While the first exemplary semiconductor structure contains a plurality of linear stress-generating stripes 50 as shown in FIGS. 7A and 7B, the second exemplary semiconductor structure contains a contiguous sheet of a stress-generating layer 50L, which comprises the same stress-generating material as the plurality of the linear stress-generating stripes 50 in the first exemplary semiconductor structure. The contiguous sheet of the stress-generating layer 50L applies both a longitudinal stress, i.e., a stress along the direction of the channel of the second field effect transistor, as well as a transverse stress, i.e., a stress perpendicular to the direction of the channel of the second field effect transistor and within the plane parallel to the interface of the gate dielectric 30 and the substrate layer 30. The longitudinal stress and the transverse stress are both compressive or both tensile.

Thus, the first exemplary semiconductor structure formed on a semiconductor substrate 8 comprises a first field effect transistor having only a first transverse stress, while the second exemplary semiconductor structure formed on the same semiconductor substrate 8 comprises a second field effect transistor having a second transverse stress and a longitudinal stress. The first transverse stress, the second transverse stress, and the longitudinal stress are of the same type, i.e., are all compressive or are all tensile.

In some instances, a transverse stress of one type, i.e., compressive or tensile, enhances performance of one type of transistor, while degrading the performance of the opposite type of transistor formed on the same semiconductor substrate. In this case, it is desirable to apply a transverse stress to only one type of field effect transistor, while eliminating stress on the opposite type of transistor.

According to a third embodiment of the present invention, any stress generated by the stress-generating material employed elsewhere on the same semiconductor substrate is eliminated in a third exemplary semiconductor structure, which is disjoined from any structure comprising the stress-generating material. In the third exemplary semiconductor structure, formation of a plurality of linear stress-generating stripes or a stress-generating layer comprising the stress-generating material is prevented on one type of field effect transistors.

The third exemplary semiconductor structure is formed on the same semiconductor substrate concurrently with the formation of the first exemplary semiconductor structure. Specifically, a first exemplary semiconductor structure containing a first field effect transistor of one conductivity type (i.e., a PFET or an NFET) as shown in FIGS. 3A and 3B and a third exemplary semiconductor structure containing a third field effect transistor of the opposite type (i.e., an NFET if the first field effect transistor is a PFET, and vice versa) and having substantially the same structure as the first exemplary semiconductor structure in FIGS. 3A and 3B (other than the differences in doping) are formed on the same semiconductor substrate 8.

Figure 10A:
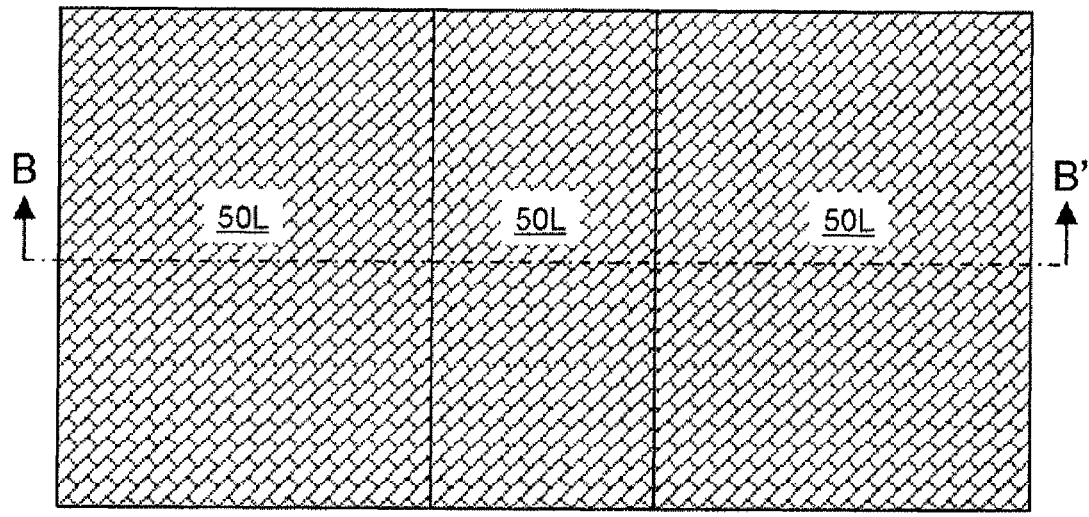
FIGS. 10A-11B are sequential views of a third exemplary semiconductor structure concurrently formed with the first exemplary semiconductor structure according to another embodiment of the present invention.
Figure 10B:
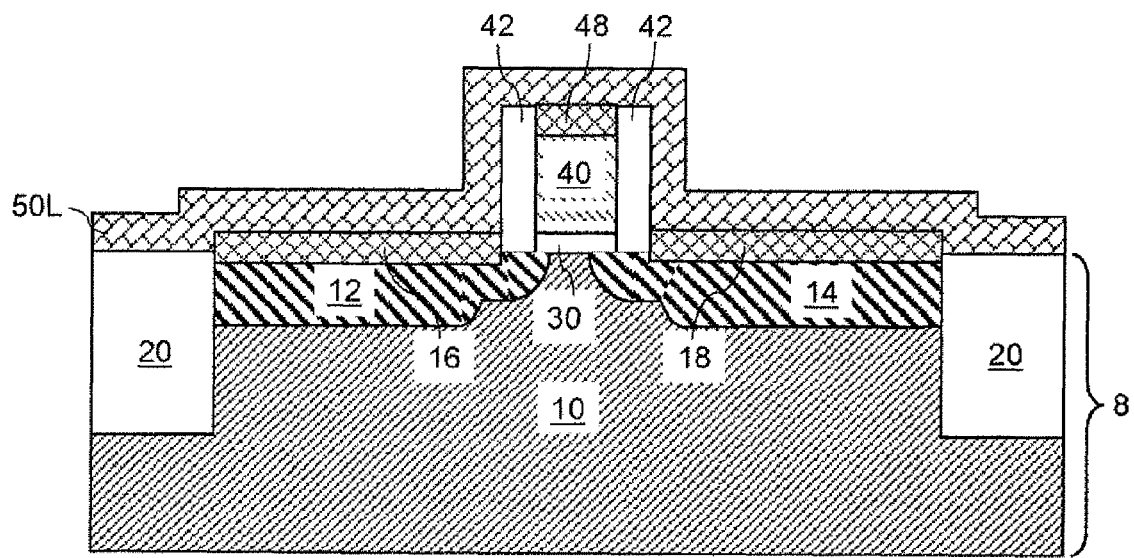

A photoresist (not shown) is applied over the first and third exemplary semiconductor structures sharing the same semiconductor substrate 8, and lithographically patterned to remove the portion of the photoresist over the third exemplary semiconductor structure, while preserving the photoresist over the first exemplary semiconductor structure. An etch is performed, employing the photoresist as an etch mask, to remove exposed portions of the non-photosensitive self-assembling block copolymer layer 60. The photoresist is thereafter removed selective to the non-photosensitive self-assembling block copolymer layer 60. Thus, the non-photosensitive self-assembling block copolymer layer 60 is present in the first exemplary semiconductor structure, while being absent in the third exemplary semiconductor structure. At this point, the third exemplary semiconductor structure is as shown in FIGS. 10A and 10B, while the first exemplary semiconductor structure is as shown in FIGS. 3A and 3B.

After the anneal, polymeric matrices 72 and polymeric stripes 70 are present only in the first exemplary semiconductor structure, while not being present in the third semiconductor structure since the non-photosensitive self-assembling block copolymer layer 60 was previously removed therefrom. During removal of exposed portions of the stress-generating layer 50L employing the polymeric stripes 70 as an etch mask, the entirety of the stress-generating layer 50L is removed from the third exemplary semiconductor structure, while a plurality of linear stress-generating stripes 50 are formed in the first exemplary semiconductor structure.

Figure 11A:
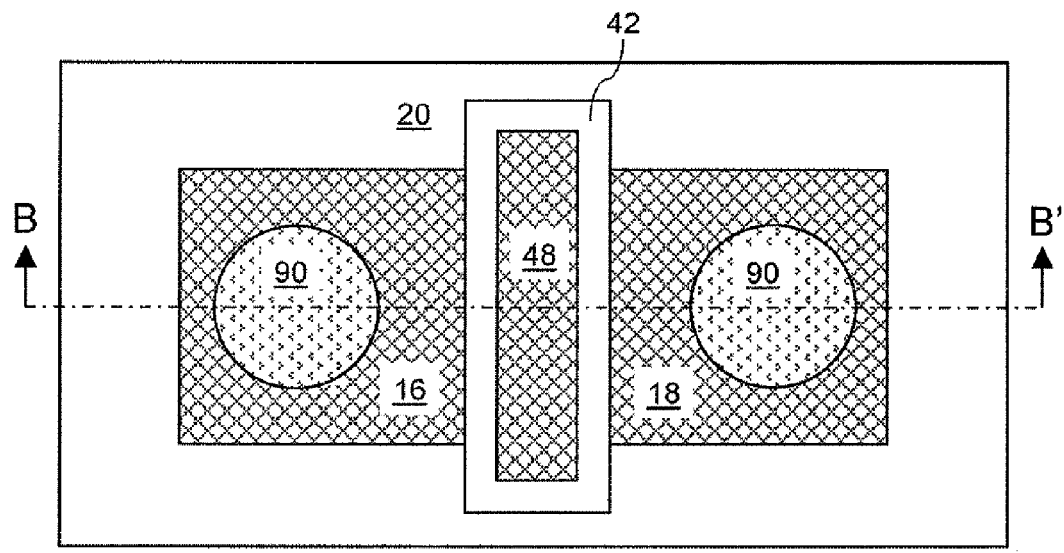
Figure 11B:
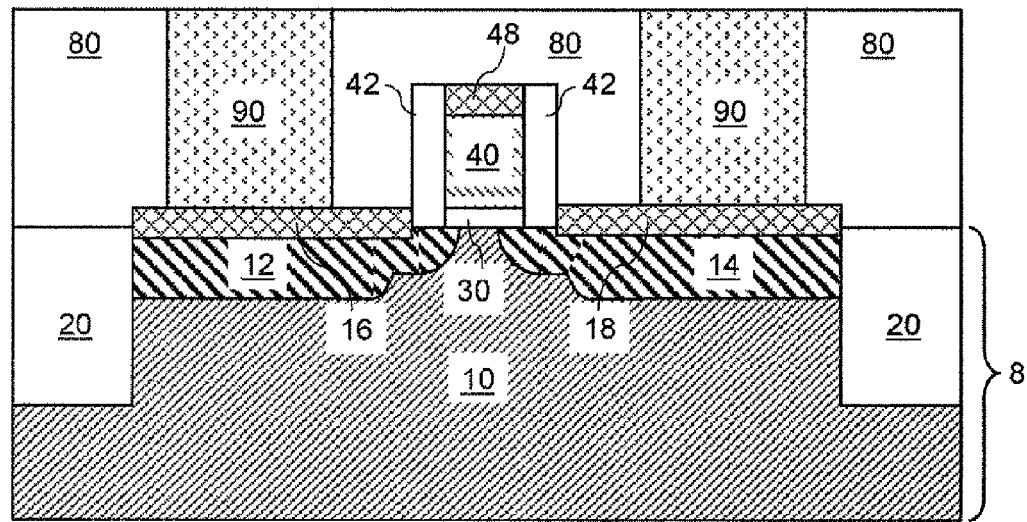

Referring to FIGS. 11A and 11B, identical processing steps are performed simultaneously on the third exemplary semiconductor structure as on the first exemplary semiconductor structure. While the first exemplary semiconductor structure contains a plurality of linear stress-generating stripes 50 as shown in FIGS. 7A and 7B, the third exemplary semiconductor structure does not contain any structure containing the same stress-generating material as the plurality of the linear stress-generating stripes 50 in the first exemplary semiconductor structure. Thus, the third exemplary semiconductor structure is disjoined from any structure containing the stress-generating material. The third exemplary semiconductor structure is substantially free of stress.

Thus, the first exemplary semiconductor structure formed on a semiconductor substrate 8 comprises a first field effect transistor having a transverse stress, while the third exemplary semiconductor structure formed on the same semiconductor substrate 8 comprises a second field effect transistor having substantially no stress. A potentially adverse impact of the transverse stress is avoided on the third field effect transistor, while the first field effect transistor benefits from the transverse stress.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure comprising:
   forming a semiconductor device structure on a semiconductor substrate, wherein said semiconductor device structure includes a gate line of a field effect transistor, wherein said gate line has a linear edge protruding above said semiconductor substrate;
   forming a stress-generating layer comprising a stress-generating material on said semiconductor device structure; and
   patterning said stress-generating layer into a plurality of linear stress-generating stripes, each having lengthwise edges that are parallel to said linear edge and laterally spaced from one another and overlying a source region and a drain region of said field effect transistor.

2. The method of claim 1, wherein said plurality of said linear stress-generating stripes applies a substantially uniaxial stress to said semiconductor device structure in a direction that is parallel to said linear edge.

3. The method of claim 1, further comprising:
   applying a non-photosensitive self-assembling block copolymer layer comprising a first polymeric block component and second polymeric block component on a substrate;
   forming a plurality of polymeric stripes comprising said first polymeric block component and having a sublithographic width by removing polymeric stripes comprising said second polymeric block component; and
   transferring a pattern present within said plurality of polymeric stripes into said stress-generating layer by an etch, whereby remaining portions of said stress-generating layer after said etch form said plurality of said linear stress-generating stripes.

4. The method of claim 3, wherein each of said plurality of said linear stress-generating stripes has a sublithographic width, wherein said width is measured in a direction perpendicular to one of said lengthwise edges.

5. The method of claim 3, further comprising:
   forming a matrix of said second polymeric block component laterally abutting and surrounding each of said plurality of said polymeric stripes; and
   removing said matrix selective to said plurality of said polymeric stripes.

6. The method of claim 1, wherein a lengthwise dimension of each of said plurality of said linear stress-generating stripes is lithographic, and wherein a spacing between an adjacent pair of said plurality of said linear stress-generating stripes is sublithographic.

7. The method of claim 1, wherein said plurality of said linear stress-generating stripes applies a substantially uniaxial stress to a channel of said field effect transistor in a direction that is parallel to a lengthwise edge of said gate conductor line.

8. The method of claim 7, further comprising:
   forming another field effect transistor on said semiconductor substrate, wherein said another field effect transistor includes another gate line, another source side metal semiconductor alloy region, and another drain side metal semiconductor alloy region,
   wherein said stress-generating layer abuts said another gate line, said another source side metal semiconductor alloy region, and said another drain side metal semiconductor alloy region upon formation, wherein said stress-generating layer applies a longitudinal stress and a transverse stress to a channel of said another field effect transistor.

9. The method of claim 8, further comprising forming another field effect transistor located on said semiconductor substrate and not directly contacting any structure comprising said stress-generating material.

10. The method of claim 1, wherein said plurality of linear stress-generating stripes does not overlie any top surface of said gate line.

* * * * *